United States Patent
Chung (10) Patent No.: US 9,390,675 B2
(45) Date of Patent: Jul. 12, 2016

(54) LIQUID CRYSTAL DISPLAY INTEGRATED WITH TOUCH SENSOR

(71) Applicant: SAMSUNG DISPLAY CO., LTD., Yongin, Gyeonggi-Do (KR)

(72) Inventor: Jae-Mo Chung, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 138 days.

(21) Appl. No.: 14/471,548

(22) Filed: Aug. 28, 2014

(65) Prior Publication Data

US 2015/0097817 A1    Apr. 9, 2015

(30) Foreign Application Priority Data

Oct. 4, 2013   (KR) .......................... 10-2013-0118337

(51) Int. Cl.
| | | |
|---|---|---|
| G09G 3/36 | (2006.01) | |
| G11C 19/28 | (2006.01) | |
| G06F 3/041 | (2006.01) | |
| G06F 3/044 | (2006.01) | |

(52) U.S. Cl.
CPC .............. *G09G 3/3696* (2013.01); *G06F 3/044* (2013.01); *G06F 3/0412* (2013.01); *G06F 3/0416* (2013.01); *G11C 19/28* (2013.01); *G06F 2203/04103* (2013.01); *G09G 3/3677* (2013.01)

(58) Field of Classification Search
CPC . G09G 3/3696; G09G 3/3677; G09G 3/3611; G09G 3/36; G06F 3/041; G06F 3/0412; G06F 3/0416; G06F 3/03545
USPC .......................................................... 345/206
See application file for complete search history.

(56) References Cited

U.S. PATENT DOCUMENTS

| | | | | |
|---|---|---|---|---|
| 2011/0061947 A1* | 3/2011 | Krah | ..................... | G06F 1/3215 178/18.01 |
| 2011/0074705 A1* | 3/2011 | Yousefpor | ............... | G06F 3/041 345/173 |
| 2012/0056835 A1 | 3/2012 | Choo et al. | | |
| 2012/0105752 A1 | 5/2012 | Park et al. | | |
| 2013/0077034 A1* | 3/2013 | Jung | ..................... | G02F 1/1345 349/122 |
| 2013/0176274 A1* | 7/2013 | Sobel | .................... | G06F 3/0416 345/174 |
| 2013/0328829 A1* | 12/2013 | Lee | ........................ | G06F 3/0412 345/174 |
| 2014/0313146 A1* | 10/2014 | Munechika | ............. | G06F 3/041 345/173 |
| 2015/0002415 A1* | 1/2015 | Lee | ..................... | G06F 3/03545 345/173 |
| 2015/0035766 A1* | 2/2015 | Chung | .................. | G06F 3/0412 345/173 |
| 2015/0338982 A1* | 11/2015 | Dufva | ................... | G06F 3/0416 345/168 |

FOREIGN PATENT DOCUMENTS

| | | |
|---|---|---|
| KR | 10-2012-0025923 A | 3/2012 |
| KR | 10-2012-0045992 A | 5/2012 |
| KR | 10-2012-0063677 A | 6/2012 |

* cited by examiner

*Primary Examiner* — Fred Tzeng
(74) *Attorney, Agent, or Firm* — Lee & Morse, P.C.

(57) ABSTRACT

A liquid crystal display with a touch sensor includes a first substrate having a plurality of pixels coupled to gate lines and data lines and a second substrate opposing the first substrate. The display also includes a plurality of common electrodes corresponding to respective pixels, a plurality of sensing electrodes on the second substrate, a touch controller to supply a channel selection signal and a touch control signal to a common electrode driver during a touch driving period, and a common electrode driver to progressively supply a touch driving signal to the common electrodes based on the channel selection signal. The touch driving signal may have the same frequency as the touch control signal.

20 Claims, 8 Drawing Sheets

LIQUID CRYSTAL DISPLAY INTEGRATED WITH TOUCH SENSOR

CROSS-REFERENCE TO RELATED APPLICATION

Korean Patent Application No. 10-2013-0118337 filed on Oct. 4, 2013, and entitled, "LIQUID CRYSTAL DISPLAY INTEGRATED WITH TOUCH SENSOR," is incorporated by reference herein in its entirety.

BACKGROUND

1. Field

One or more embodiments described herein relate to a touch sensor.

2. Description of the Related Art

A variety of flat panel displays have been developed to replace cathode ray tubes. One example is a liquid crystal display (LCD), which displays images using optical anisotropy of liquid crystals. This type of display is used in notebook computers and desktop monitors because it has excellent resolution, color rendering capability, and picture quality. In order to provide for convenient input of information and commands, LCDs have been developed with touch screen functions. However, the touch sensor and display in these LCDs are individually produced. The touch sensor is then attached to the display.

SUMMARY

In accordance with one embodiment, a liquid crystal display with a touch sensor includes a first substrate including a plurality of pixels coupled to gate lines and data lines; a second substrate opposing the first substrate; a plurality of common electrodes corresponding to respective pixels; a plurality of sensing electrodes on the second substrate; a touch controller to supply a channel selection signal and a touch control signal to a common electrode driver during a touch driving period; and a common electrode driver to progressively supply a touch driving signal to the common electrodes based on the channel selection signal, the touch driving signal having a same frequency as the touch control signal.

The touch controller may change the frequency of the touch control signal. The touch controller may maintain the frequency of the channel selection signal when the frequency of the touch control signal is changed.

The display may include a data driver to output a data signal to the data lines during a display period; and a gate driver to output a gate-on signal to the gate lines during the display period. The gate driver may output a gate-off signal to the gate lines during the touch driving period. The display period and touch driving period may alternately repeat. The common electrode driver may supply a same common voltage to the common electrodes during the display period. The gate driver may include a plurality of stages to receive first and second clock signals.

The display may include a display controller to supply the first and second clock signals to the gate driver, in synchronization with the channel selection signal, during the touch driving period.

Each stage of the gate driver may include a first transistor coupled between a first clock terminal and an output terminal, the first transistor having a gate electrode coupled to a first node; a second transistor coupled between a first input terminal and the first node, the second transistor having a gate electrode coupled to the first input terminal; a third transistor coupled between the first node and a voltage terminal, the third transistor having a gate electrode coupled to a second input terminal; a fourth transistor coupled between the output terminal and the voltage terminal, the fourth transistor having a gate electrode coupled to a second clock terminal; a fifth transistor coupled between the output terminal and the voltage terminal, the fifth transistor having a gate electrode coupled to a second node; a sixth transistor coupled between the second node and the voltage terminal, the sixth transistor having a gate electrode coupled to the first node; and a seventh transistor coupled between the first node and the voltage terminal, the seventh transistor having a gate electrode coupled to the second node.

Each stage of the gate driver may include a first capacitor coupled between the first node and output terminal; and a second capacitor coupled between the first clock terminal and second node. The first and second clock signals may respectively input to the first and second clock terminals of an odd-numbered stage, and the second and first clock signals may respectively input to the first and second clock terminals of an even-numbered stage.

A scan start signal or the gate-on signal of a previous stage may be input to the first input terminal, and the gate-on signal of a next stage may be input to the second input terminal. A gate-off voltage may be applied to the voltage terminal. The first and second clock signals may have opposite phases.

The common electrodes may be positioned on the first or second substrate. Alignment of the liquid crystal layer may be controlled by an electric field between pixel electrodes and the common electrodes The common electrodes and sensing electrodes may be positioned in directions intersecting each other. The display may include a back light below the first substrate. A liquid crystal layer may be positioned between the first and second substrates.

In accordance with another embodiment, a controller includes a touch controller to generate a channel selection signal during a display period and a touch control signal during a touch driving period; and a common electrode driver to progressively supply the touch driving signal to a plurality of common electrodes based on the channel selection signal, the touch driving signal has a same frequency as the touch control signal.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
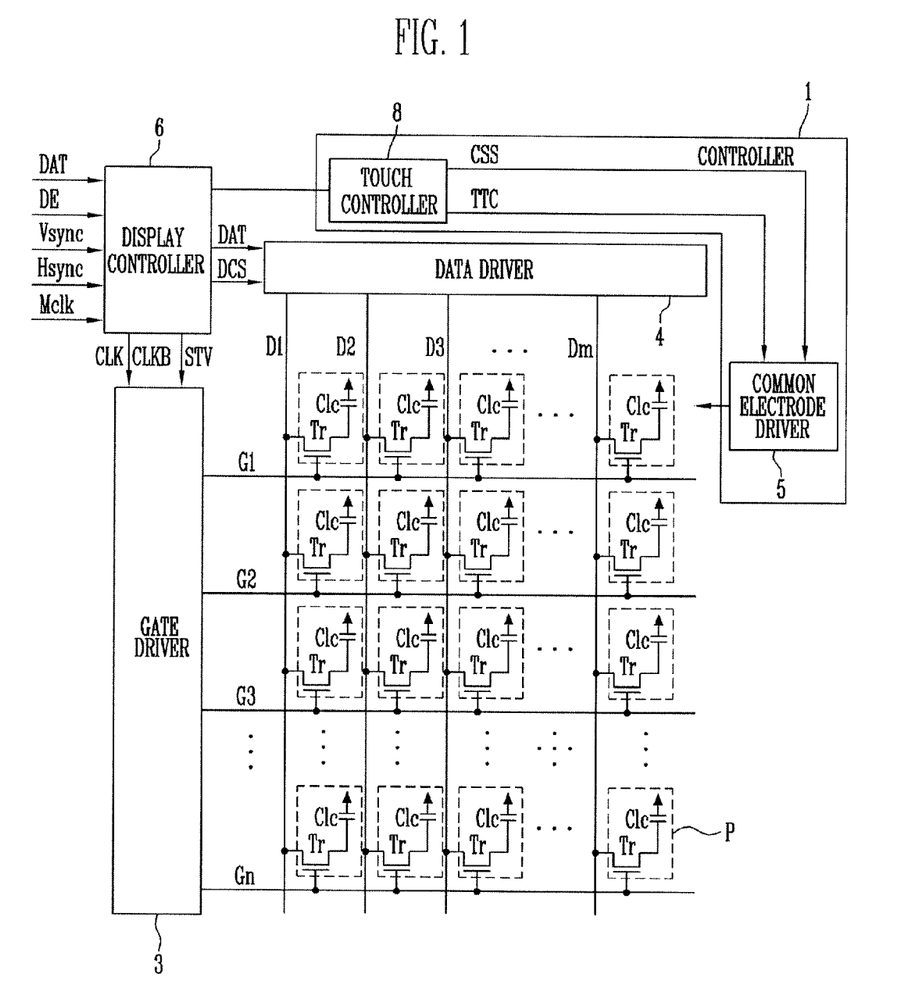
FIG. 1 illustrates an embodiment of a liquid crystal display with a touch sensor.
Figure 2:
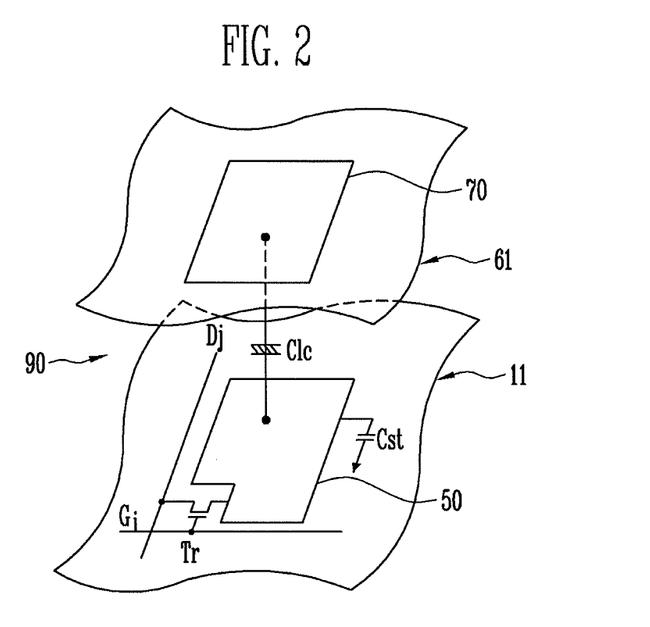
FIG. 2 illustrates an embodiment of a pixel.
Figure 3:
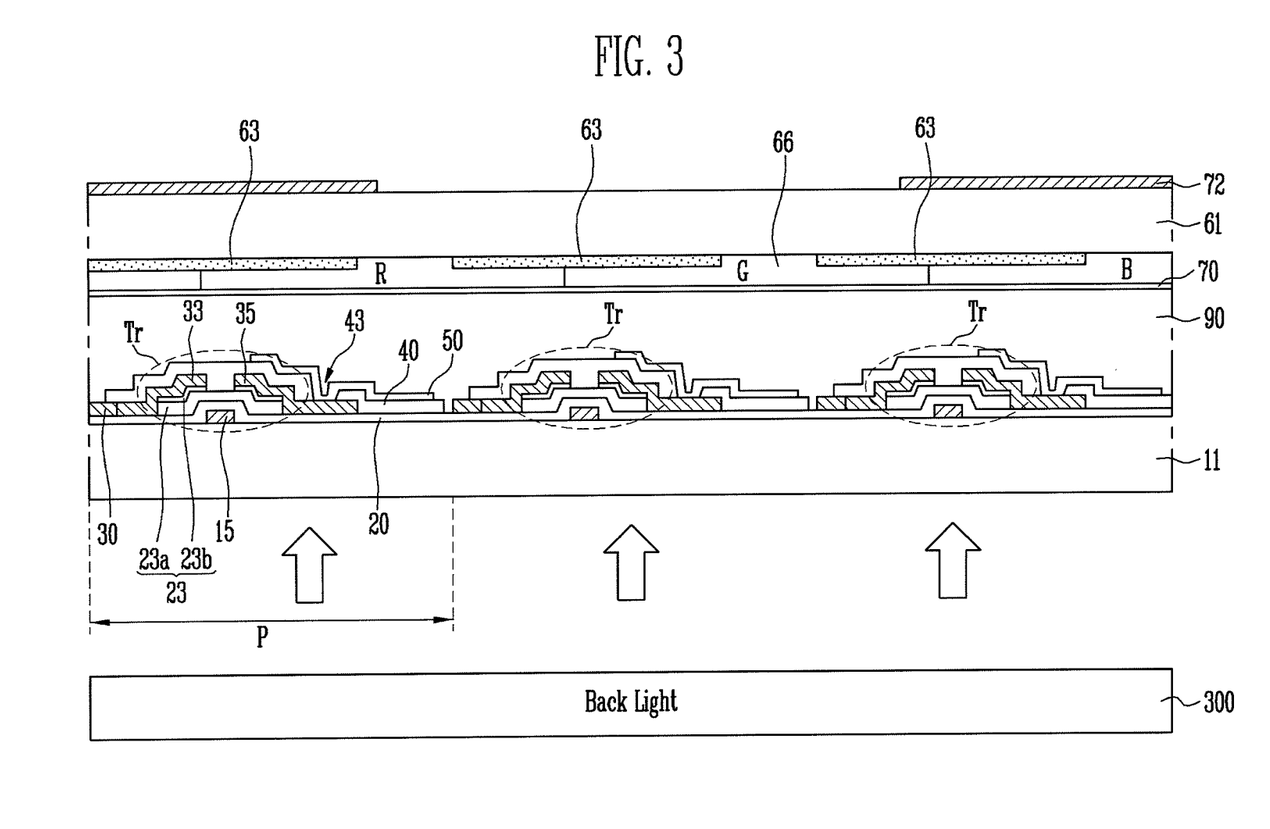
FIG. 3 illustrating an example of a region of the liquid crystal display.
Figure 4:
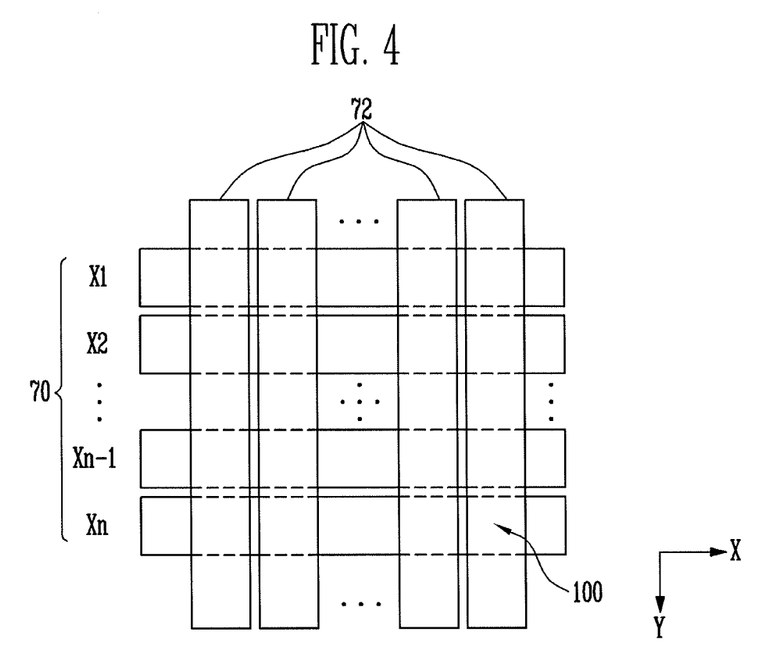
FIG. 4 illustrates common and sensing electrodes according to one embodiment.

FIG. 1 illustrates an embodiment of a liquid crystal display (LCD) integrated with a touch sensor. Particularly, a configuration for displaying an image of the LCD will be mainly shown in FIG. 1. FIG. 2 illustrates an embodiment of a pixel in FIG. 1. FIG. 3 illustrates a sectional view of a region of the LCD according to one embodiment. FIG. 4 illustrates common electrodes and sensing electrodes according to one embodiment.

As shown in FIG. 1, the LCD includes a gate driver 3 to supply a gate signal to gate lines G1 to Gn arranged in a first direction (e.g., a horizontal direction), and a data driver 4 to supply data signals to data lines D1 to Dm arranged in a second direction (e.g., a vertical direction) intersecting the first direction. A plurality of pixels P are coupled to gate lines G1 to Gn and data lines D1 to Dm. A common electrode driver 5 controls a common electrode 70. A display controller 6 controls gate driver 3 and data driver 4. A touch controller 8 controls common electrode driver 5.

The LCD is a display which generates an image using optical anisotropy and polarization properties of liquid crystals. The liquid crystals have optical anisotropy in which the molecular structure of the liquid crystals is thin and long and the alignment of the liquid crystals has directivity. The polarization properties of the molecular arrangement of the liquid crystals have a direction changed depending on the size of the liquid crystals, when the liquid crystals are placed in an electric field.

Accordingly, the LCD includes a liquid crystal panel configured by joining first and second substrates with pixel electrodes, a common electrode, and a liquid crystal layer interposed therebetween. In the LCD, a predetermined electric field is formed by respectively applying a data signal and a common voltage between the common electrode and pixel electrode of each pixel selected by a gate signal. The transmittance of light from a back light is controlled according to the arrangement angle of the liquid crystals, changed by the predetermined electric field, to thereby display an image.

To control alignment of the liquid crystal layer, the LCD includes a twisted nematic (TN) mode, a vertical alignment (VA) mode, an in-plane switching (IPS) mode, a plane-to-line switching (PLS) mode, etc. Among these modes, the IPS or PLS mode is a method in which pixel electrodes 50 and a common electrode 70 are all disposed on a lower substrate (e.g., a first substrate 11). Thus, alignment of a liquid crystal layer is controlled by an electric field between pixel electrodes 50 and common electrode 70.

Although FIG. 2 illustrates that common electrode 70 is positioned on a second substrate 61, in other embodiments applied common electrode 70 is positioned, together with pixel electrodes 50, on first substrate 11 in the IPS or PLS mode or another mode.

Referring to FIGS. 2 and 3, the LCD has a configuration in which the first and second substrates 11 and 61 are joined together while facing each other. In this case, the gate lines G1 to Gn and data lines D1 to Dm vertically intersecting each other are arranged on the lower first substrate 11. Transistors Tr are respectively provided at intersection points of the gate lines G1 to Gn and data lines D1 to Dm, and are coupled one-by-one to pixel electrodes 50 in pixels P.

This arrangement will be described in detail with reference to FIG. 2. The pixel P coupled to an i-th gate line Gi and a j-th data line Dj may include a transistor Tr coupled to the i-th gate line Gi and the j-th data line Dj, a pixel electrode 50 coupled to the transistor Tr, a liquid crystal capacitor Clc positioned between the pixel electrode 50 and common electrode 70, and a storage capacitor Cst. In one embodiment, the storage capacitor Cst may be omitted.

The transistor Tr, as shown in FIG. 3, may be configured to include a gate electrode 15 coupled to a gate line, source/drain electrodes 33 and 35, and a semiconductor layer 23 between the gate electrode 15 and source/drain electrodes 33 and 35. The semiconductor layer 23 may include an active layer 23a and an ohmic contact layer 23b.

A gate insulating layer 20 is formed on gate electrode 15. A protective layer 40 is formed on source/drain electrodes 33 and 35. The protective layer 40 may have a contact hole 43 through which drain electrode 35 is exposed.

A pixel electrode is formed on protective layer 40. The pixel electrode 50 may be coupled to the drain electrode 35 through contact hole 43. The transistor Tr is not limited to the structure shown in FIG. 3, and may have a different structure in other embodiments.

The liquid crystal capacitor Clc uses pixel electrode 50 and common electrode 70 of second substrate 61 as two terminals. A liquid crystal layer 90 between two electrodes 50 and 70 may serve as a dielectric.

A lattice-shaped black matrix 63 may be formed on a rear surface of second substrate 61. The black matrix 63 surrounds the area of each pixel P to cover a non-display area, including gate lines G1 to Gn, data lines D1 to Dm, the transistors Tr, etc. Color filter patterns 66 arranged corresponding to respective pixels P may exist inside black matrix 63, and a plurality of common electrodes 70 may exist beneath the color filter patterns 66. In this case, color filter patterns 66 may include red, green, and blue color filter patterns R, G and B repetitively arranged in sequence. Here, an overcoat layer may be formed between color filter pattern 66 and common electrode 70.

The position of black matrix 63 and the color filter pattern 66 may be changed. Therefore, in a case where the black matrix 63 and the color filter pattern 66 are formed at another position, the common electrode 70 may be formed on an inner surface of the second substrate 61. The common electrode 70 may be formed of a transparent conductive material or another conductive material such as an opaque metal. For example, common electrode 70 may be formed of indium tin oxide (ITO), indium zinc oxide (IZO), graphene, carbon nanotube, silver nanowires (AgNWs), etc.

Although it has been illustrated in FIG. 2 that common electrode 70 is positioned on second substrate 61, common electrode 70 is not positioned on the second substrate 61 but may be positioned on first substrate 11. In this case, common electrode 70 may be formed in the same layer as pixel electrode 50, or may be formed in a different layer according to the alignment of liquid crystal layer 90. A back light 300 may be positioned below first substrate 11.

An image display operation of the LCD configured as described above will now be described. First, if a gate-on signal is applied to gate electrode 15 of transistor Tr in each pixel P, the active layer 23a is activated. Accordingly, source electrode 33 transfers a data signal from data line 30 coupled thereto to drain electrode 35, spaced apart therefrom at a predetermined interval, via lower active layer 23a.

In this case, drain electrode 35 is electrically coupled to pixel electrode 50 through contact hole 43. Thus, the voltage of the data signal is applied to pixel electrode 50. The applied voltage may be stored in storage capacitor Cst in each pixel P.

Accordingly, the arrangement of liquid crystal molecules between the pixel and common electrodes 50 and 70 are controlled based on a voltage corresponding to the difference between the voltage applied to pixel electrode 50 and the voltage applied to common electrode 70, to thereby display a predetermined image.

In some types of LCDs, the common electrode is integrally formed on the entire lower surface of a second substrate, so that the same voltage is applied to the common electrode. On the other hand, in the LCD according to the present embodiment, a plurality of common electrodes are separately provided from one another. Accordingly, common electrodes 70 can be used as touch sensing electrodes of a mutual capacitive touch sensor.

Referring to FIG. 4, common electrode 70 is formed long in a first direction (e.g., an X-axis direction), so that a plurality of common electrodes are be arranged along a second direction (e.g., a Y-axis direction) intersecting the first direction. For example, common electrode 70 may be configured to include first to n-th common electrodes X1 to Xn. For example, a case where n common electrodes X1 to Xn exist has been shown as an example in FIG. 4.

In this case, a sensing electrode 72 is positioned to be spaced apart from common electrode 70. Accordingly, sensing electrode 72 may operate together with the common electrode, as a capacitive touch sensor.

To this end, sensing electrode 72 may be positioned on second substrate 61 to intersect common electrode 70. For example, sensing electrode 72 is formed long in the second direction (e.g., the Y-axis direction), so that a plurality of sensing electrodes are arranged along the first direction (e.g., the X-axis direction).

Through this arrangement of the common electrode 70 and sensing electrode 72, mutual capacitance between common electrode 70 and sensing electrode 72 is formed at intersection portions of common electrode 70 and sensing electrode 72. Accordingly, each intersection portion at which the mutual capacitance is formed may operate as a sensing cell 100 which implements touch recognition. The sensing electrode 72 may be formed, for example, of ITO, IZO, graphene, carbon nanotube, AgNWs, etc.

The display controller 6 may receive an image signal DAT input from an external source and an input control signal for controlling the display of the image data signal DAT. The display controller 6 may process the image data signal DAT to satisfy operational conditions and then provide the processed image signal to data driver 4.

The display controller 6 may provide a data control signal DCS, together with the image signal DAT, to data driver 4. For example, display controller 6 may receive input control signals such as a vertical synchronization signal Vsync, a horizontal synchronization signal Hsync, a main clock signal Mclk and a data enable signal DE, which are input from the outside of the LCD, and output the data control signal DCS.

For example, data control signal DCS may include a source start pulse SSP, a source shift clock signal SSC, a source output enable signal SOE, a polarity control signal POL, etc.

Accordingly, data driver 4 may receive the image signal DAT and data control signal DCS from display controller 6 and supply a data signal corresponding to the image signal DAT to each of the data lines D1 to Dm. For example, data driver 4 may supply the data signal to pixels P, in synchronization with a gate-on signal Gon supplied during a display period Pd.

Meanwhile, display controller 6 may provide gate driver 3 with first and second clock signals CLK and CLKB for controlling gate driver 3. The display controller 6 may supply, to gate driver 3, a scan start signal STV together with the clock signals CLK and CLKB. The gate driver 3 may receive the clock signals CLK and CLKB and the scan start signal STV from display controller 6, and supply a gate signal to gate lines G1 to Gn.

The gate signal from gate driver 3 may include a gate-on signal Gon to turn on transistor Tr in each pixel P and a gate-off signal Goff to turn off transistor Tr. For example, gate driver 3 may progressively supply the gate-on signal Gon to gate lines G1 to Gn during the display period Pd.

Thus, if the gate-on signal Gon is progressively supplied to gate lines G1 to Gn, pixels P are progressively selected for each line, and the selected pixels P can receive the data signal transferred from the data lines D1 to Dm.

In this case, the first clock signal CLK and the second clock signal CLKB may have phases opposite to each other. The gate driver 3 may output the gate-off signal Goff to the gate lines G1 to Gn during a touch driving period Pt. In this case, the display period Pd and the touch driving period Pt may be alternately repeated.

The common electrode driver 5 performs a function of controlling the plurality of common electrodes 70. In this case, the common electrode driver 5 may be driven corresponding to a channel selection signal CSS supplied from touch controller 8. For example, common electrode driver 5 may supply, to all common electrodes 70, a common voltage Vcom at which each pixel P normally emits light during the display period Pd.

The common electrode driver 5 may supply, to common electrodes 70, a touch driving signal Td for touch sensing during the touch driving period Pt. For example, the touch controller 8 may supply channel selection signal CSS to the common electrode driver 5 during the touch driving period Pt. The common electrode driver 5 may progressively supply touch driving signal Td to common electrodes 70 corresponding to channel selection signal CSS. In one embodiment, common electrode driver 5 and touch controller 8 may be considered as a controller 1, as illustrated in FIG. 1.

Because the channel selection signal CSS is not supplied in display period Pd, common electrode driver 5 may apply the same common voltage Vcom to all common electrodes 70 during display period Pd.

The touch controller 8 may supply a touch control signal TTC to the common electrode driver 5. Accordingly, the common electrode driver 5 may supply, to the common electrodes 70, touch driving signal Td having the same frequency as the touch control signal TTC, with reference to the touch control signal TTC.

The touch controller 8 may perform the function of controlling the common electrode driver 5. To this end, touch controller 8 may supply channel selection signal CSS and touch control signal TTC to common electrode driver 5.

For example, the touch controller 8 may supply the channel selection signal CSS to the common electrode driver 5 during the touch driving period Pt, to control the common electrode driver 5 to provide the touch driving signal Td to the common electrodes 70.

The touch controller 8 may change the frequency of the touch control signal TTC in order to ensure stable touch sensing performance according to a change in peripheral environment. Accordingly, the frequency of the touch driving signal Td supplied by the common electrode driver 5 is also changed.

However, the touch controller 8 does not change the frequency of the channel selection signal CSS, but may maintain the frequency of the channel selection signal CSS even when the frequency of the touch control signal TTC is changed.

The touch controller 8 may detect a touch position based on a signal output from the sensing electrode 72. The touch controller 8 may also supply the channel selection signal CSS to the display controller 6.

The display controller 6 and the touch control unit 8 independently exist, or the display controller 6 and the touch controller 8 may be integrated as one component.

The display controller 6 may supply the first and second clock signals CLK and CLKB to gate driver 3, in synchronization with the channel selection signal CSS. Therefore, the frequencies of the first and second clock signals CLK and CLKB during the touch driving period Pt in which the channel selection signal CSS is supplied may be different from those in the display period Pd. For example, in a case where the first and second clock signals CLK and CLKB have a first frequency in the display period Pd, the first and second clock signals CLK and CLKB may have a second frequency different from the first frequency in the touch driving period Pt.

Figure 5:
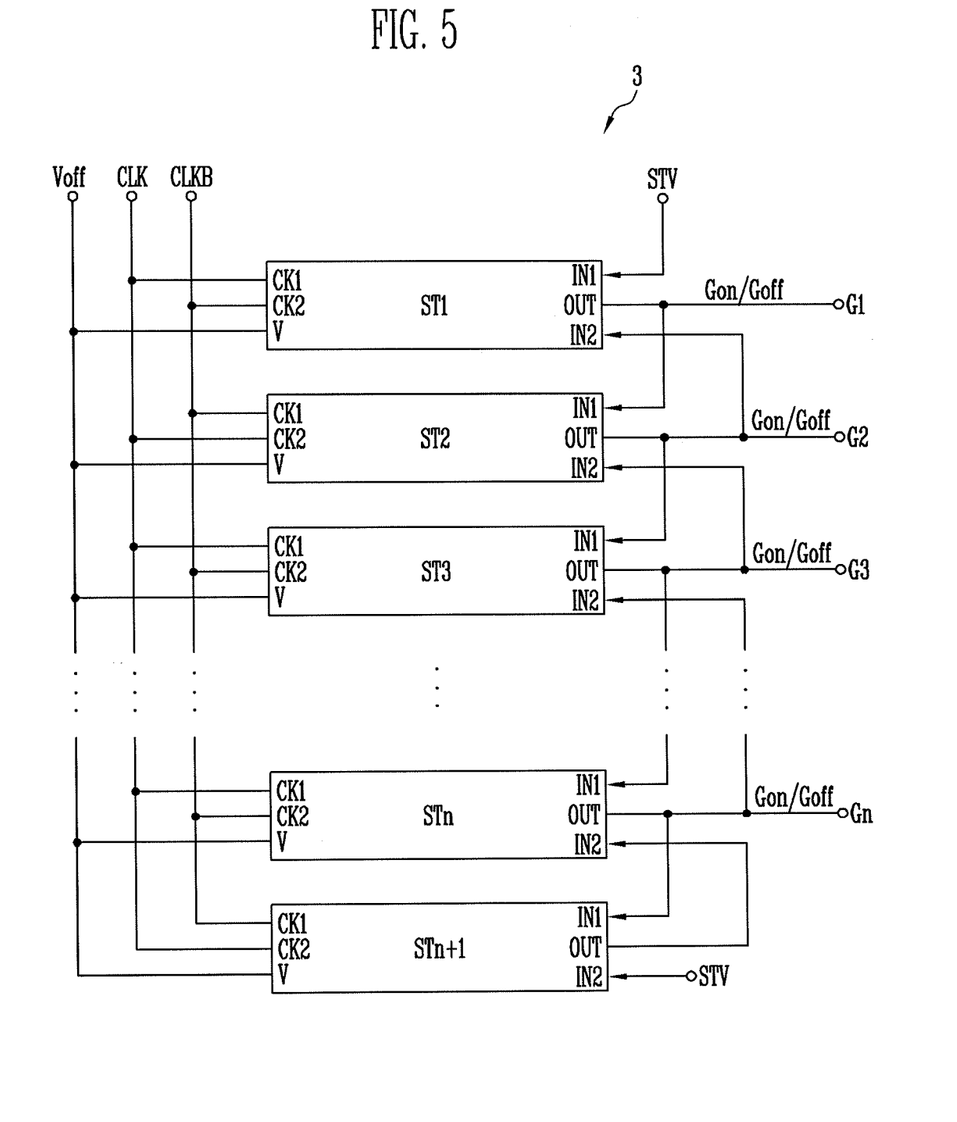
FIG. 5 illustrates an embodiment of a gate driver.

FIG. 5 illustrates an embodiment of the gate driver 3 shown in FIG. 1. Referring to FIG. 5, gate driver 3 includes a plurality of stages ST1 to STn+1 which receive the first clock signal CLK, the second clock signal CLKB and the gate-off voltage Voff. For example, the number of gate lines is n, the stages may be configured with n stages ST1 to STn corresponding to the respective gate lines and one dummy stage STn+1.

Each of the stages ST1 to STn+1 includes a first clock terminal CK1, a second clock terminal CK2, a voltage terminal V, a first input terminal IN1, a second input terminal IN2 and an output terminal OUT. The output terminals OUT of the n stages ST1 to STn may be respectively coupled to the corresponding gate lines G1 to Gn. The output OUT of the dummy stage STn+1 may be coupled to the second input terminal IN2 of the previous stage STn.

The clock signals CLK and CLKB supplied from display controller 6 may be respectively input to clock terminals CK1 and CK2 of each stage ST1 to STn+1. For example, the first clock signal CLK may be input to the first clock terminal CK1 of an odd-numbered stage ST1, ST3, . . . , and the second clock signal CLKB may be input to the second clock terminal CK2 of the odd-numbered stage ST1, ST3, . . . .

In addition, second clock signal CLKB may be input to the first clock terminal CK1 of an even-numbered stage ST2, ST4, . . . , and the first clock signal CLK may be input to the second clock terminal CK2 of the even-numbered stage ST2, ST4, . . . .

The gate-off voltage Voff may be input to the voltage terminal V of each of the stages ST1 to STn+1. The gate-off voltage Voff is a voltage at which the transistor Tr included in each pixel P can be turned off. In this case, the gate-off voltage Voff may be set to a voltage of the gate-off signal Goff.

The scan start signal STV may be input to the first input terminal IN1 of the first stage ST1. The gate-on signal Gon of the previous stage may be input to the first input terminal IN1 of each of the other stages ST2 to STn+1. The gate-on signal Gon of the next stage may be input to the second input terminal IN2 of each of the n stages ST1 to STn. The scan start signal STV or a separate control signal may be input to the second input terminal IN2 of the dummy stage STn+1.

Figure 6:
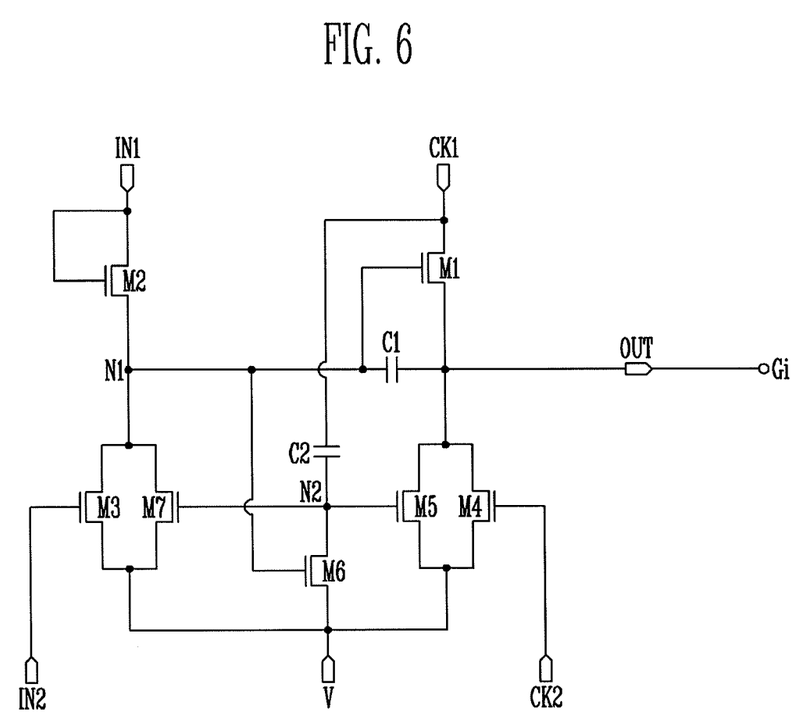
FIG. 6 illustrates an embodiment of a stage in FIG. 5.

FIG. 6 illustrates an embodiment of the stage shown in FIG. 5. Referring to FIG. 6, each of the stages ST1 to STn+1 may include first to seventh transistor M1 to M7 and capacitors C1 and C2.

The first transistor M1 is coupled between the first clock terminal CK1 and the output terminal OUT. A gate electrode of the first transistor M1 is coupled to a first node N1.

The second transistor M2 is coupled between the first input terminal IN1 and the first node N1. A gate electrode of the second transistor M2 is coupled to the first input terminal IN1.

The third transistor M3 is coupled between the first node N1 and the voltage terminal V. A gate electrode of the third transistor M3 is coupled to the second input terminal IN2.

The fourth transistor M4 is coupled between the output terminal OUT and the voltage terminal V. A gate electrode of the fourth transistor M4 is coupled to the second clock terminal CK2.

The fifth transistor M5 is coupled between the output terminal OUT and the voltage terminal V. A gate electrode of the fifth transistor M5 is coupled to a second node N2.

The sixth transistor M6 is coupled between the second node N2 and the voltage terminal V. A gate electrode of the sixth transistor M6 is coupled to the first node N1.

The seventh transistor M7 is coupled between the first node N1 and the voltage terminal V. A gate electrode of the seventh transistor M7 is coupled to the second node N2.

The first capacitor C1 is coupled between the first node N1 and the output terminal OUT.

The second capacitor C2 is coupled between the first clock terminal CK1 and the second node N2.

Figure 7:
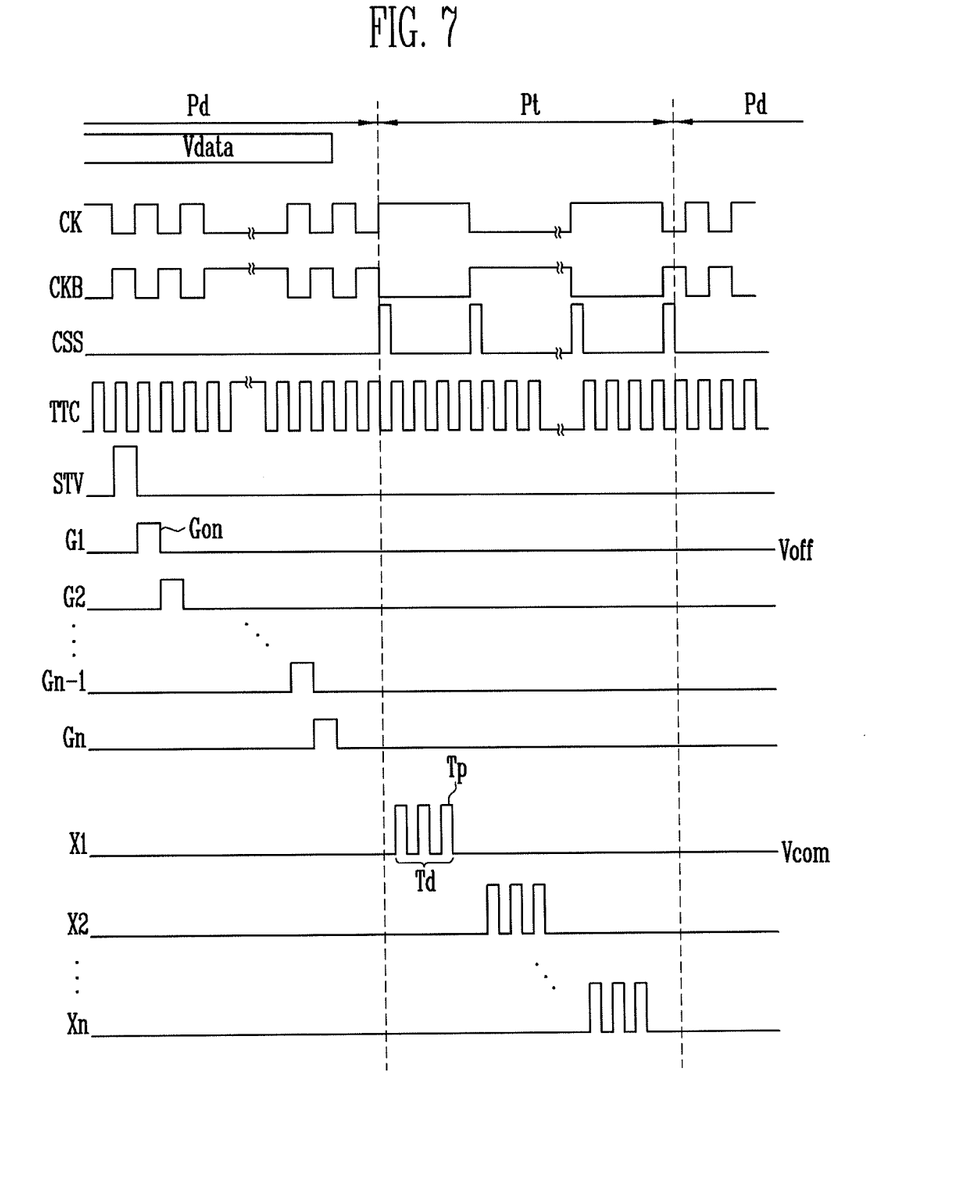
FIG. 7 illustrates operation of the display according to one embodiment.

FIG. 7 is a waveform diagram illustrating operation of the LCD according to one embodiment. Particularly, a case where the common electrode 70 is configured with first to n-th common electrodes X1 to Xn is shown in FIG. 7.

Referring to FIG. 7, the LCD may be operated in a period divided into a display period Pd and a touch driving period Pt. The display period Pd and touch driving period Pt may be alternately repeated. The display period Pd refers to a period in which a predetermined image is displayed according to a data signal Vdata supplied to pixels P.

The voltage of the common electrode 70 is maintained constant so that the image is normally displayed. Therefore, the common voltage Vcom with the same level may be supplied to all the common electrodes 70.

To this end, the common electrode driver 5 may supply the common voltage Vcom with the same amplitude to each common electrode 70 during the display period Pd. The gate driver 3 may progressively supply the gate-on signal Gon to the gate lines G1 to Gn during the display period Pd.

To this end, display controller 6 may supply the scan start signal STV to the gate driver 3 in an early stage of the display period Pd. The display controller 6 may supply the first and second clock signals CLK and CLKB having a first frequency to the gate driver 3 during the display period Pd. The channel selection signal CSS may not be supplied during the display period Pd.

The touch driving period Pt refers to a period in which the LCD is driven as a capacitive touch sensor for the purpose of touch recognition. The common electrode 70 may be used, together with the sensing electrode 72, as a touch sensing electrode during the touch driving period Pt.

The gate driver 3 may maintain the output of the gate-off signal Goff during the touch driving period Pt. Thus, the gate lines G1 to Gn can maintain the gate-off voltage Voff during the touch driving period Pt.

In order to implement touch recognition during the touch driving period Pt, the touch driving signal Td may be progressively supplied to the plurality of common electrodes 70. For example, in a case where the common electrode 70 is configured with the first to n-th common electrodes X1 to Xn, the touch driving signal Td may be progressively supplied from the first common electrode X1 to the n-th common electrode Xn.

The touch driving signal Td, as shown in FIG. 7, may be configured with a plurality of driving pulses Tp. In this case, the common electrode driver 5, during the touch driving period Pt, may supply the touch driving signal Td to the common electrode 70, corresponding to the channel selection signal supplied from the touch controller 8.

For example, the common electrode driver 5 may supply the touch driving signal Td to the first common electrode X1, corresponding to a first channel selection signal CSS. The common electrode driver 5 may supply the touch driving signal Td to the n-th common electrode Xn, corresponding to an n-th channel selection signal CSS.

During the touch driving period Pt, the display controller 6 may supply the first and second clock signals CLK and CLKB to the gate driver 3, in synchronization with the channel selection signal CSS. For example, the first and second clock signals CLK and CLKB, during the touch driving period Pt, may have a second frequency lower than the first frequency in the display period Pd. Accordingly, the frequency of the clock signals CLK and CLKB may be lowered during touch driving period Pt, to reduce power consumption of the LCD.

Figure 8:
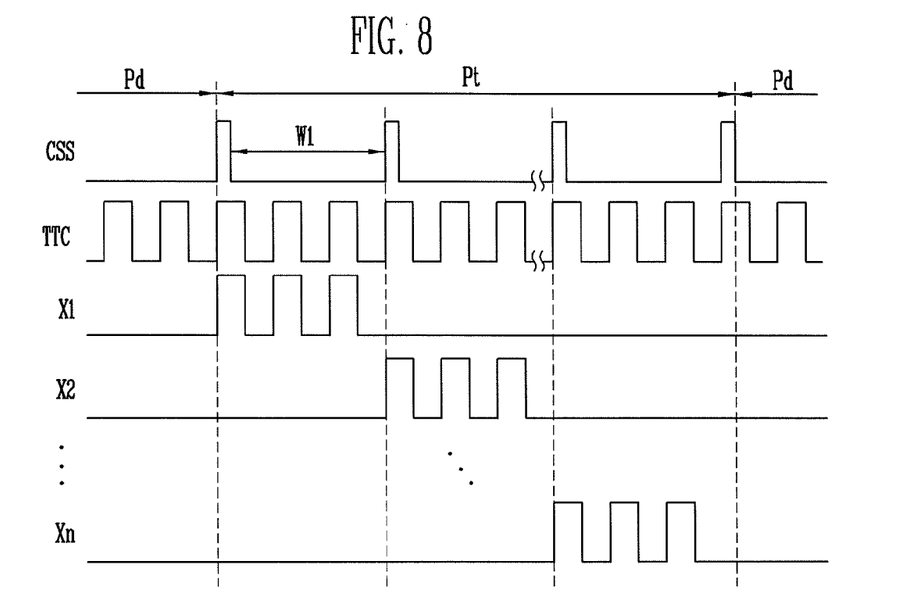
FIG. 8 illustrates an embodiment of a frequency changing operation of touch control signals.
Figure 9:
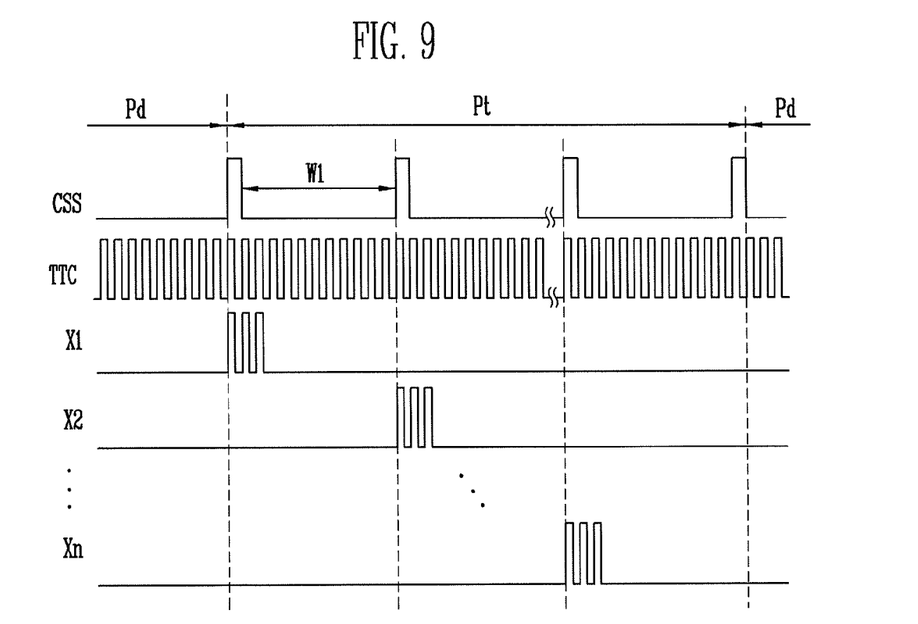
FIG. 9 illustrates another embodiment of a frequency changing operation of touch control signals.

FIGS. 8 and 9 are waveform diagrams illustrating frequency changing operations of touch control signals according to embodiments. FIG. 8 illustrates a touch control signal TTC having a frequency A, and FIG. 9 illustrates a touch control signal TTC having a frequency B higher than the frequency A.

In FIG. 8, touch control signal TTC has the frequency A. Thus, the touch driving signal Td supplied from common electrode driver 5 also has frequency A.

In FIG. 9, touch control signal TTC has frequency B. Thus, the touch driving signal Td supplied from common electrode driver 5 also has frequency B.

Although the frequency of the touch control signal TTC is changed, the frequency of the channel selection signal CCS may be maintained. For example, although the frequency of touch control signal TTC is changed, the width W1 between the channel selection signals CCS may be maintained.

By way of summation and review, in order to provide for convenient input of information and commands, LCDs have been developed with touch screen functions. However, the touch sensor and display in these LCDs are individually produced. The touch sensor is then attached to the display. When the touch sensor is attached to the display, an adhesive layer is required between the touch sensor and display. Also, a process for forming the touch sensor is required to be performed separately from the process of forming the display. Therefore, processing time and costs are increased.

In accordance with one or more of the aforementioned embodiments, an LCD is provided with an integrated touch sensor. The touch sensor is driven by a touch driving signal. The frequency of the touch driving signal may be changed and power consumption may be reduced.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A liquid crystal display with a touch sensor, the display comprising:
    a first substrate including a plurality of pixels coupled to gate lines and data lines;
    a second substrate opposing the first substrate;
    a plurality of common electrodes corresponding to respective pixels;
    a plurality of sensing electrodes on the second substrate;
    a touch controller to supply a channel selection signal and a touch control signal to a common electrode driver during a touch driving period; and
    a common electrode driver to progressively supply a touch driving signal to the common electrodes based on the channel selection signal, the touch driving signal having a same frequency as the touch control signal.

2. The display as claimed in claim 1, wherein the touch controller is to change the frequency of the touch control signal.

3. The display as claimed in claim 2, wherein the touch controller is to maintain the frequency of the channel selection signal when the frequency of the touch control signal is changed.

4. The display as claimed in claim 1, further comprising:
    a data driver to output a data signal to the data lines during a display period; and
    a gate driver to output a gate-on signal to the gate lines during the display period.

5. The display as claimed in claim 4, wherein the gate driver is to output a gate-off signal to the gate lines during the touch driving period.

6. The display as claimed in claim 4, wherein the display period and touch driving period are alternately repeated.

7. The display as claimed in claim 4, wherein the common electrode driver is to supply a same common voltage to the common electrodes during the display period.

8. The display as claimed in claim 4, wherein the gate driver includes a plurality of stages to receive first and second clock signals.

9. The display as claimed in claim 8, wherein each stage of the gate driver includes:
    a first transistor coupled between a first clock terminal and an output terminal, the first transistor having a gate electrode coupled to a first node;
    a second transistor coupled between a first input terminal and the first node, the second transistor having a gate electrode coupled to the first input terminal;
    a third transistor coupled between the first node and a voltage terminal, the third transistor having a gate electrode coupled to a second input terminal;
    a fourth transistor coupled between the output terminal and the voltage terminal, the fourth transistor having a gate electrode coupled to a second clock terminal;

a fifth transistor coupled between the output terminal and the voltage terminal, the fifth transistor having a gate electrode coupled to a second node;

a sixth transistor coupled between the second node and the voltage terminal, the sixth transistor having a gate electrode coupled to the first node; and a seventh transistor coupled between the first node and the voltage terminal, the seventh transistor having a gate electrode coupled to the second node.

10. The display as claimed in claim 9, wherein each stage of the gate driver further includes:

a first capacitor coupled between the first node and output terminal; and a second capacitor coupled between the first clock terminal and second node.

11. The display as claimed in claim 10, wherein:

the first and second clock signals are respectively input to the first and second clock terminals of an odd-numbered stage, and the second and first clock signals are respectively input to the first and second clock terminals of an even-numbered stage.

12. The display as claimed in claim 11, wherein:

a scan start signal or the gate-on signal of a previous stage is input to the first input terminal, and the gate-on signal of a next stage is input to the second input terminal.

13. The display as claimed in claim 12, wherein a gate-off voltage is applied to the voltage terminal.

14. The display as claimed in claim 8, wherein the first and second clock signals have opposite phases.

15. The display as claimed in claim 1, further comprising:

a display controller to supply the first and second clock signals to the gate driver, in synchronization with the channel selection signal, during the touch driving period.

16. The display as claimed in claim 1, wherein the common electrodes are positioned on the first or second substrate.

17. The display as claimed in claim 1, wherein the common electrodes and the sensing electrodes are positioned in directions intersecting each other.

18. The display as claimed in claim 1, further comprising:

a back light below the first substrate.

19. The display as claimed in claim 1, further comprising:

a liquid crystal layer positioned between the first and second substrates, alignment of the liquid crystal layer being controlled by an electric field between pixel electrodes and the common electrodes.

20. A controller, comprising:

a touch controller to generate a channel selection signal during a display period and a touch control signal during a touch driving period; and a common electrode driver to progressively supply the touch driving signal to a plurality of common electrodes based on the channel selection signal, the touch driving signal having a same frequency as the touch control signal.

* * * * *